April 27, 1965 J. D. JONES 3,181,068

HIGH FREQUENCY TRANSISTOR CIRCUITS

Filed Aug. 4, 1961 2 Sheets-Sheet 1

Inventor
J. D. JONES
By
Holcombe, Wetherill & Brisebois
Attorneys

Inventor
J. D. JONES
By
Holcomb, Wetherill & Brisebois
Attorneys

United States Patent Office 3,181,068
Patented Apr. 27, 1965

3,181,068
HIGH FREQUENCY TRANSISTOR CIRCUITS
James D. Jones, Cambridge, England, assignor to Pye Limited, Cambridge, England, a British company
Filed Aug. 4, 1961, Ser. No. 129,432
Claims priority, application Great Britain, Aug. 19, 1960, 28,815/60
6 Claims. (Cl. 325—436)

The present invention relates to transistor circuits for handling high frequency signals and more particularly but not exclusively, to circuits which are intended to handle television and sound signals which occur within the frequency ranges known as Band I (41–68 mc./s.), Band II (87.5–100 mc./s.) and Band III (174–216 mc./s.).

From one aspect the present invention provides a mixer circuit for mixing high frequency signals with a local oscillator frequency in order to produce an output intermediate frequency, said mixer circuit employing a transistor, wherein in order to compensate for undesirable feedback of the output frequency to the input of said transistor, means are provided for feeding back to the input of said transistor a portion of said output frequency which is 180 degrees out of phase with the undesirable feedback and of an amplitude at least substantially to cancel out said undesirable feedback.

The invention also provides a mixer circuit employing a transistor wherein a portion of the output frequency at the collector of said transistor is applied to the input circuit connected to the base of said transistor so as to be in 180 degree phase relationship with the undesirable feedback of said output frequency through said transistor and of an amplitude at least substantially to eliminate said undesirable feedback.

The mixer circuit according to this invention may form part of a tuner unit as is commonly employed in television receivers at the present time.

According to a feature of the invention a tuner unit comprises a transistor amplifier coupled to the transistor mixer stage through a band pass circuit, wherein the band pass coupling is achieved at the higher frequencies on which the tuner is to operate by means of inductively coupled loops, the spacing of said loops determining the bandwidth of the circuit, and at the lower frequencies on which the tuner is to operate additional coupling is provided between the tuning coils for those frequencies. The tuner unit may also include a local oscillator provided with means for maintaining the oscillator frequency substantially stable with variations in its supply voltage within limits.

Figure 5:
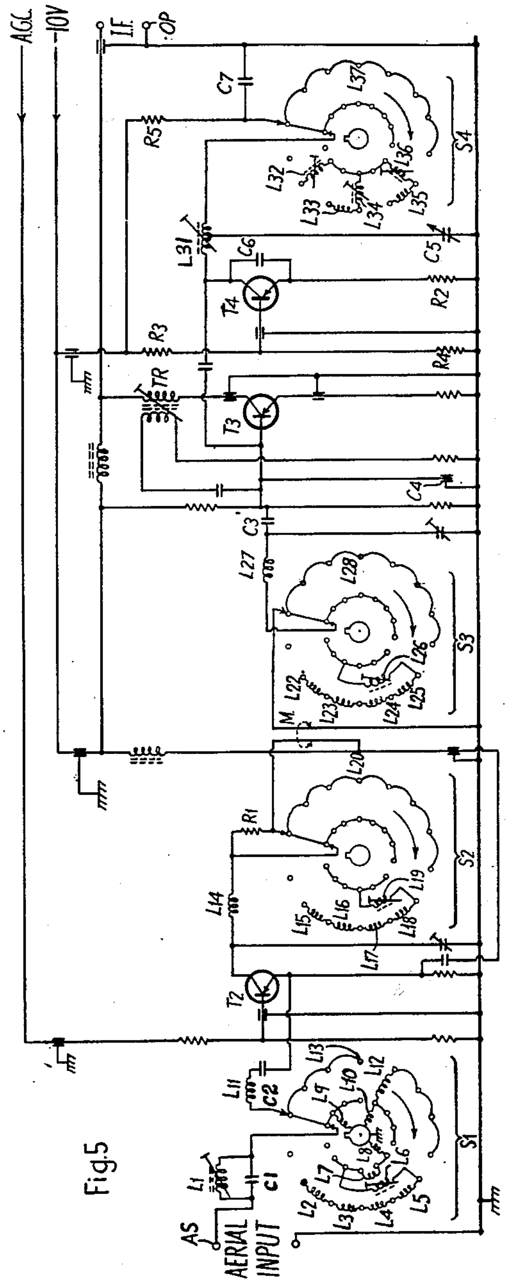
Figure 7:
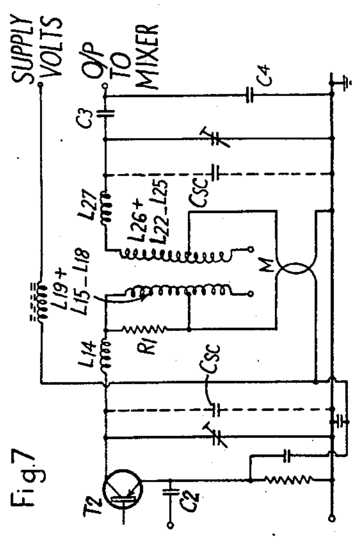
Figure 1:
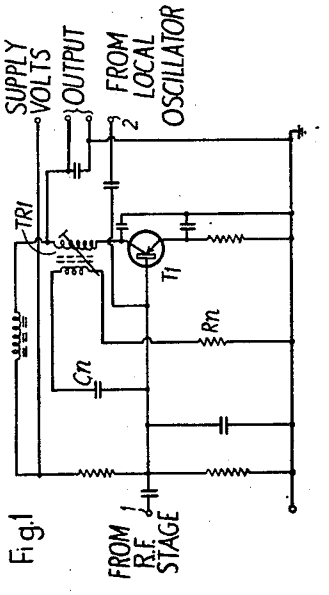
Figure 2:
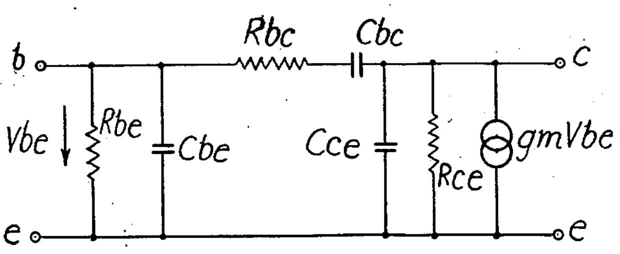
Figure 3:
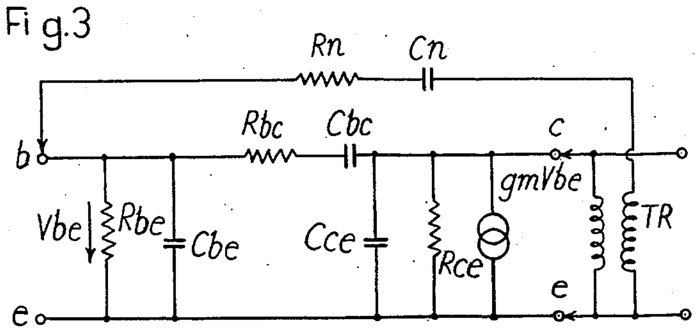
Figure 4:
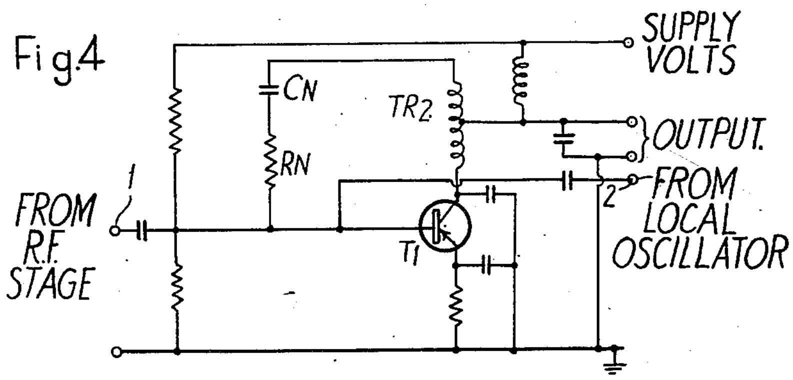
Figure 6:
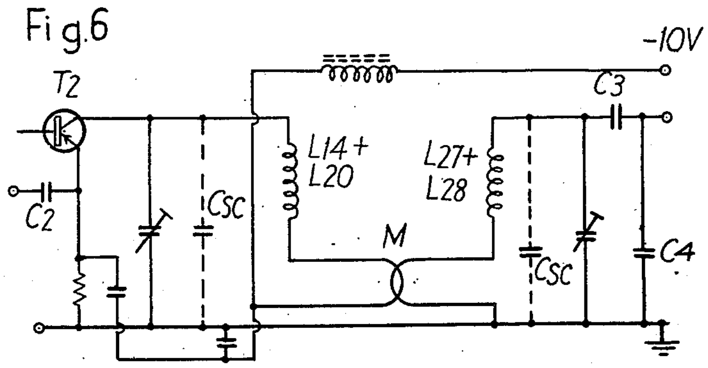

In order that the invention may be more fully understood, reference will now be made to the accompanying drawings, in which:

FIGURE 1 is a circuit diagram of one embodiment of mixer circuit according to this invention, FIGURES 2 and 3 are equivalent circuits of parts of the mixer, FIGURE 4 is a circuit diagram of a further embodiment of mixer circuit, FIGURE 5 is a circuit diagram of a tuner unit according to this invention, FIGURE 6 is a circuit diagram illustrating the band pass coupling in the tuner unit for Band III operation, and FIGURE 7 is a circuit diagram illustrating the band pass coupling of the tuner unit for Band I operation.

Referring to the drawings and more particularly to FIGURES 1 to 3, FIGURE 1 shows a mixer circuit including a transistor T1, into the base of which is fed an R.F. input signal via terminal 1 and the output from a local oscillator via terminal 2. The primary of the transformer TR1 is connected to the collector of the transistor and forms part of the band pass coupling circuit to the succeeding I.F. amplifier stage. The secondary of the transformer TR provides a feedback path with 180 degrees phase change from the output to the input circuit of the mixer stage. The two reactive components $C_n$ and $R_n$ are included to give phase correction, as will be shown. The undesirable feedback to the input circuit takes place through the transistor by means of the components $R_{bc}$ and $C_{bc}$ as shown in FIGURE 2 which is an equivalent circuit of the transistor. FIGURE 3 shows the equivalent circuit with the addition of the external feedback by means of a 1:1 transformer. It will be realized that there is some phase change through the transistor and so as to achieve complete cancellation of the undesired feedback, the values of $R_n$ and $C_n$ will be those of $R_{bc}$ and $C_{bc}$. If, however, a transformer is used having a step down ratio $N$:1, the voltage in the secondary will be reduced by that ratio and it will be necessary to make the external feedback components $R_n$ and $C_n$ equal to $$\frac{R_{bc}}{N}$$

and $NC_{bc}$ respectively. In FIGURES 2 and 3 it will be understood that $R_{bc}$ and $C_{bc}$ represent respectively the base-collector resistance and capacity, $R_{be}$ and $C_{be}$ represent respectively the base-emitter resistance and capacity, while $R_{ce}$ and $C_{ce}$ represent respectively the collector-emitter resistance and capacity. $V_{be}$ is the base-emitter voltage.

FIGURE 4 shows a modification of the embodiment shown in FIGURE 1 where an auto-transformer TR2 is used as the load for the transistor and as the feedback source.

The mixer circuit according to the present invention enables the signal frequency circuits to be tuned very near to the intermediate frequency without detrimental effects. Moreover the circuit provides substantially complete cancellation both in magnitude and phase of the intermediate frequency feedback which in turn produces a general improvement at all signal frequencies, besides which other feedback from the output circuit of the mixer is also cancelled out. In addition no separate tuning for the feedback circuit is required.

FIGURE 5 shows a circuit diagram of a tuner unit according to the present invention intended for operation on Band I and Band III and which can be switch tuned to any of the 13 channels at present available on these frequency bands.

Referring to FIGURE 5, signals from the aerial are fed via the aerial input socket AS to a high pass filter circuit formed by the wave trap circuit L1, C1 and the switched tuning coils L2 to L10 and L12 and L13. The filter is such that it will pass the sound carrier of channel 1 i.e. 41.5 mc./s. but reject lower frequencies. The parallel tuned circuit consisting of L11 plus the additional coils for the channel switched into operation and tuned by their self-capacities is matched to the input transistor T2, connected in the grounded base configuration by means of the capacitor C2 and the emitter-base capacity of the transistor. An automatic gain control potential is applied to the base of T2. The coils L2 to L10, L12 and L13 form a section S1 of a switched tuning unit which also comprises sections S2, S3 and S4.

The output from transistor T2 is coupled to the mixer stage comprising transistor T3 by means of a band pass circuit including switched coil sections S2 and S3. This band pass circuit has a different coupling for Band I and Band III operation. FIGURE 6 shows the basic coupling arrangements for Band III operation, and it will be seen that coupling only takes place by means of the loops "M" the spacing of these loops deciding the bandwidth. On Band I there is additional coupling between the tuning coils in the primary and secondary sections of the band pass circuit this being shown in FIGURE 7. There is also included across the primary coils a resistor R1 which loads the tuned circuit so that the Q of the primary and secondary will be the same, so as to achieve a symmetrical band pass curve.

The secondary of the band pass circuit is fed to the base of the mixer stage T3 together with the output from the local oscillator stage T4, an impedance match being made between the band pass circuit and the mixer by the capacitors C3 and C4 (FIGURES 6 and 7). The mixer stage operates as already described with reference to FIGURES 1 to 3, its output at the intermediate frequency being derived from terminals OP.

The local oscillator stage T4 is fundamentally a Colpitts circuit, the frequency of oscillation being determined by selection of the coils L32 and L37. The Channel 13 oscillator coil L31 is always in the circuit, the fine tuning capacitor C5 being connected to a tap on this coil. By placing the fine tuning capacitor over a section of the Band III oscillator coils, a smaller sweep is achieved than if the capacitor were placed across the whole of the Band III coils. The tuning capacitor is however, placed effectively across the Band I oscillator coils, so as to give sufficient fine tuning adjustment on Band I operation. Changes of frequency due to changes in ambient temperature are compensated by employing capacitors of the negative temperature coefficient type for either C6 or C7 or both of these capacitors.

An undesirable feature encountered in existing transistor oscillator circuits, especially those which derive their power from batteries, is that any change in the supply voltage will produce a corresponding change in the frequency of oscillation this particularly being a drawback with oscillators which are switch tuned i.e. set to a fixed frequency. This disadvantage is overcome in the present oscillator in the following way:

(1) The optimum value for the resistance R2 in the emitter arm of the transistor T4 is determined by means known in the art.

(2) The power required at the output of the oscillator is established and is set by adjusting the biassing resistors R3 and R4.

(3) The resistance R5 in the collector arm of the transistor is now made equal to a value which is the resistance in the emitter arm multiplied by the working current gain of the transistor, i.e. $R5=R2\times\beta$.

It has been found that with this arrangement the oscillator frequency can be kept substantially stable over supply voltage changes of the order of ±30%.

If the resistor R5 has a value above or below the optimum value then an increase or decrease of frequency of oscillation will result from a reduction in the supply voltage, depending on whether the resistive value is increased or decreased. The opposite effects will be observed if the supply voltage is increased.

The oscillator circuit above described forms the subject of my copending application No. 129,433 of even date entitled "Transistor Oscillators."

While particular embodiments have been described it will be understood that various modifications may be made without departing from the scope of this invention. Thus the circuits may be designed to operate on other frequency bands besides those specifically described.

I claim:

1. A mixer circuit for mixing high frequency signals with a local oscillator frequency in order to produce an output intermediate frequency, said mixer circuit comprising a transistor, means for feeding the high frequency signals to the base of said transistor, means for feeding the local oscillator signals to the base of said transistor, means for deriving an output intermediate frequency from the collector of said transistor and a feedback circuit including components of resistance and capacity dimensioned to counter the base collector resistance and capacity of said transistor connected from the collector to the base of said transistor for feeding back to the input of said transistor a portion of said output intermediate frequency which is 180° out of phase with undesirable feedback of said output intermediate frequency through said transistor and which is of an amplitude at least substantially to eliminate said undesirable feedback.

2. A mixer circuit for mixing high frequency signals with a local oscillator frequency in order to produce an output intermediate frequency, said mixer circuit comprising a transistor, means for feeding the high frequency signals to the base of said transistor, means for feeding the local oscillator signals to the base of said transistor, a transformer having a primary winding connected to the collector of said transistor for deriving an output intermediate frequency from the collector of said transistor, a secondary winding on said transformer, a capacitor connected between one end of said secondary winding and the base of said transistor, a resistor connected between the other end of said secondary winding and a point of fixed potential, said capacitor and said resistor being dimensioned to counter the base collector capacity and resistance of said transistor, said transformer secondary winding, said capacitor and said resistor forming a feedback circuit for feeding back to the input of said transistor a portion of said output intermediate frequency which is 180° out of phase with undesirable feedback of said output intermediate frequency through said transistor and which is of an amplitude at least substantially to eliminate said undesirable feedback.

3. A mixer circuit for mixing high frequency signals with a local oscillator frequency in order to produce an output intermediate frequency, said mixer circuit comprising a transistor, means for feeding the high frequency signals to the base of said transistor, means for feeding the local oscillator signals to the base of said transistor, an auto transformer connected to the collector of said transistor and having a tapping for deriving an output intermediate frequency from the collector of said transistor, a feedback circuit connected from said auto transformer through a capacitor and a resistor, which are dimensioned to counter the base collector capacity and resistance of said transistor, to the base of said transistor for feeding back to the input of said transistor a portion of said output intermediate frequency which is 180° out of phase with undesirable feedback of said output intermediate frequency through said transistor and which is of an amplitude at least substantially to eliminate said undesirable feedback.

4. A high frequency tuner unit incorporating a transistor amplifier for amplifying high frequency signals, a mixer circuit for mixing said high frequency signals with a local oscillator frequency in order to produce an output intermediate frequency, a band pass circuit coupling the output frequency from said amplifier circuit to said mixer circuit, said band pass circuit comprising inductively coupled loops effective at higher frequencies on which said tuner operates and the spacing of said loops determining the band width of the band pass circuit and an additional band pass coupling means effective at lower frequencies on which said tuner operates, said mixer circuit comprising a transistor, means for feeding the high frequency signals to an input electrode of said transistor, means for feeding the local oscillator signals to said input electrode of said transistor, means for deriving an output intermediate frequency from an output electrode of said transistor and a feedback circuit connected from said output electrode to said input electrode of said transistor and including components of resistance and capacity dimensioned to counter the base collector resistance and capacity of said transistor, for feeding back to the input of said transistor a portion of said output intermediate frequency which is 180° out of phase with undesirable feedback of said output intermediate frequency through said transistor and which is of an amplitude at least substantially to eliminate said undesirable feedback.

5. A high frequency tuner unit incorporating a transistor amplifier for amplifying high frequency signals, a mixer circuit for mixing said high frequency signals with a local oscillator frequency in order to produce an output intermediate frequency, a band pass circuit coupling the output frequency from said amplifier circuit to said mixer circuit, said band pass circuit comprising inductively coupled loops effectve at higher frequencies on which said tuner operates and the spacing of said loops determining the band width of said band pass circuit and additional band pass coupling means effective at lower frequencies on which said tuner operates, said mixer circuit comprising a transistor, means for feeding the high frequency signals to an input electrode of said transistor, means for feeding the local oscillator signals to said input electrode of said transistor, means for deriving an output intermediate frequency from an output electrode of said transistor and a feedabck circuit connected from said output electrode to said input electrode of said transistor and including components of resistance and capacity dimensioned to counter the base collector resistance and capacity of said transistor for feeding back to the input of said transistor a portion of said output intermediate frequency which is 180° out of phase with undesirable feedback of said output intermediate frequency through said transistor and which is of an amplitude at least substantially to eliminate said undesirable feedback, a local oscillator for generating said local oscillator frequency, a direct current power supply for said tuner and means for maintaining the local oscillator frequency substantially stable with variations in said supply voltage.

6. A tuner unit as claimed in claim 5, wherein the local oscillator comprises a transistor having an emitter and a collector, and a resistance in series with the collector of a value which is equal to the product of the resistance in series with the emitter and the working current gain of the transistor when the transistor is biassed to produce the desired power output from the oscillator.

References Cited by the Examiner

UNITED STATES PATENTS

| | | | |
|---|---|---|---|
| 1,812,066 | 6/31 | Terman | 329—168 |
| 2,503,780 | 4/50 | Ziel | 325—430 |
| 2,581,159 | 1/52 | Achenbach | 325—489 |
| 2,772,355 | 11/56 | Deutsch | 325—462 |
| 2,828,410 | 3/58 | Rongen | 325—440 |

DAVID G. REDINBAUGH, *Primary Examiner.*

ROY LAKE, *Examiner.*